United States Patent [19]

Rustomji

[11] Patent Number: 4,511,599
[45] Date of Patent: Apr. 16, 1985

[54] MASK FOR VACUUM DEPOSITING BACK METAL ELECTRODES ON EL PANEL

[75] Inventor: Sam H. Rustomji, Camarillo, Calif.

[73] Assignee: Sigmatron Associates, Los Angeles, Calif.

[21] Appl. No.: 470,935

[22] Filed: Mar. 1, 1983

[51] Int. Cl.³ .................... B05D 5/12; B05D 1/32
[52] U.S. Cl. .................................... 427/66; 427/69; 427/99; 427/109; 427/282
[58] Field of Search .............. 427/99, 109, 69, 66, 427/282

[56] References Cited

U.S. PATENT DOCUMENTS

| | | | |
|---|---|---|---|
| 3,510,349 | 5/1970 | Jones | 427/99 |
| 4,273,812 | 6/1981 | Tsutsui | 427/99 |
| 4,335,161 | 6/1982 | Luo | 427/99 |

Primary Examiner—John D. Smith
Attorney, Agent, or Firm—John T. Matlago

[57] ABSTRACT

A thin flexible steel mask is provided for use in vacuum depositing high resolution back metal electrodes on the surface of a glass substrate already having deposited thereon front transparent electrodes and a thin-film structure including an electroluminescent layer sandwiched between layers of a dielectric.

The spaced filaments provided on the mask for defining the openings through which the metal electrodes are deposited are joined together along the lengths thereof by reinforcing portions which provide for rigidly holding the filaments in the plane of the mask and enable a permanent magnet to retain the filaments of the mask in position flush against the surface of the substrate. After the metal has been deposited a first time through the openings in the mask, the mask is repositioned on the substrate such that the reinforcing portions now lie over the areas already deposited on and uncover the portions of the substrate that have yet to be deposited on. The metal is then deposited a second time through the openings in the mask to complete the forming of the electrodes on the substrate.

6 Claims, 12 Drawing Figures

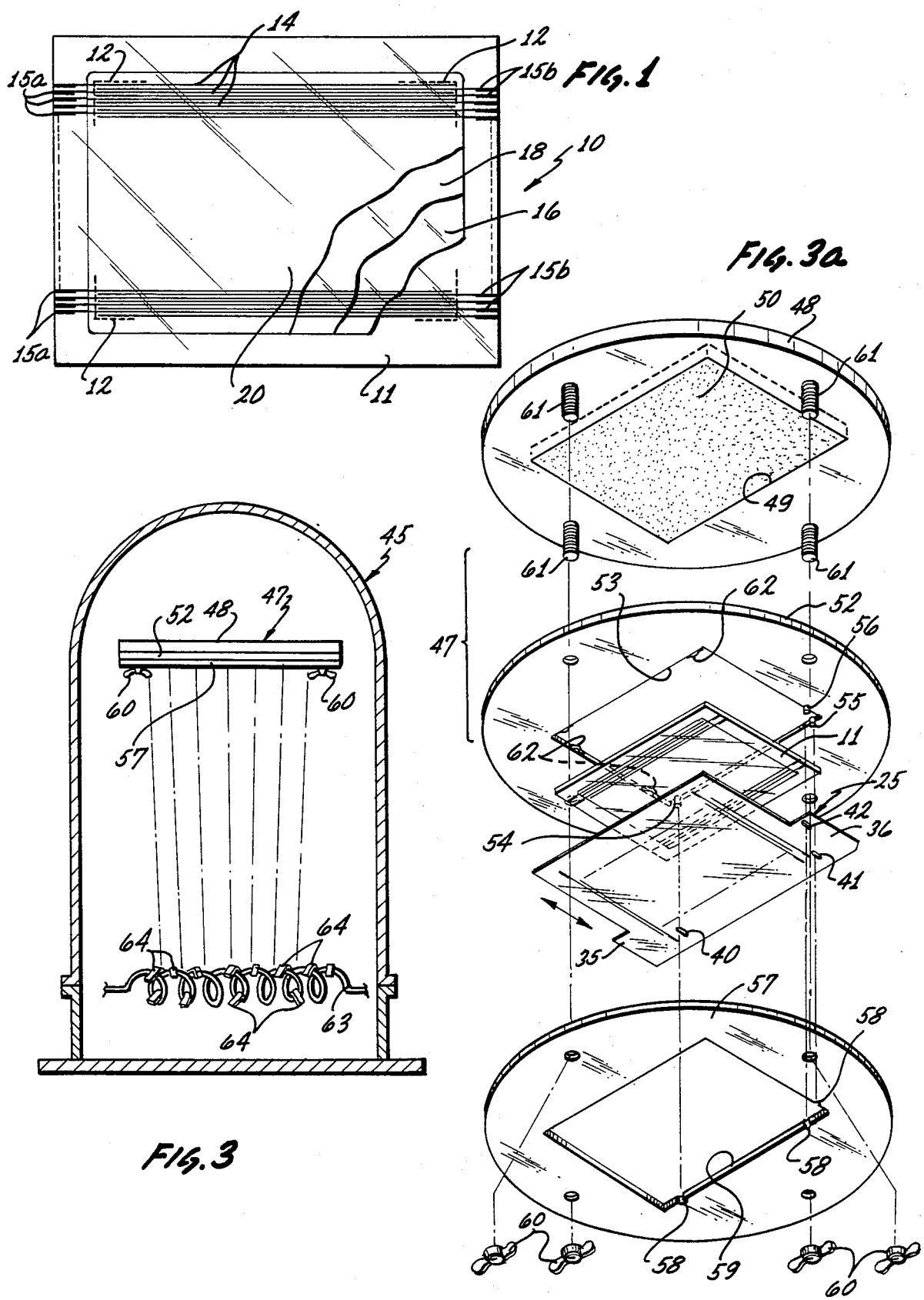

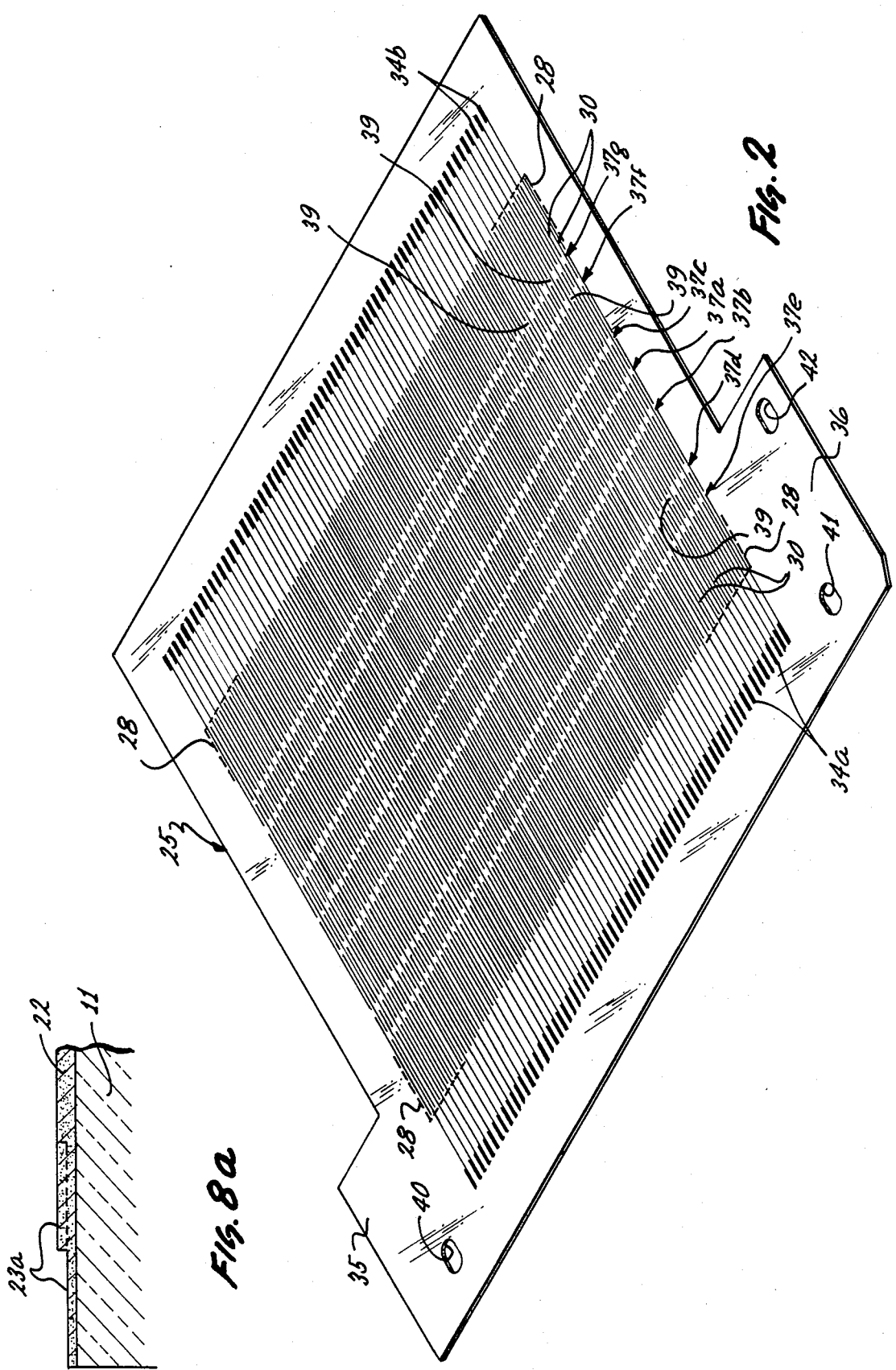

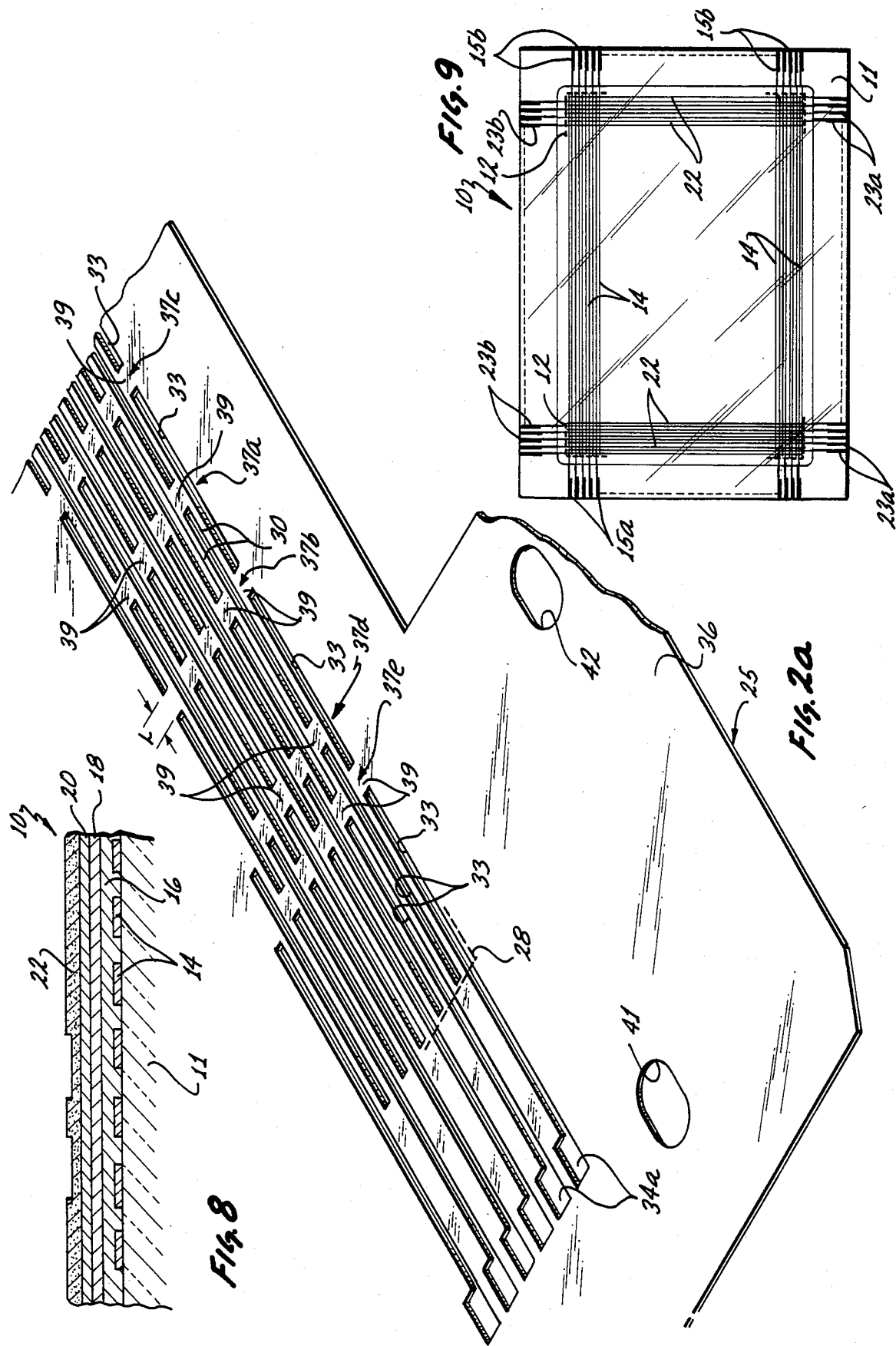

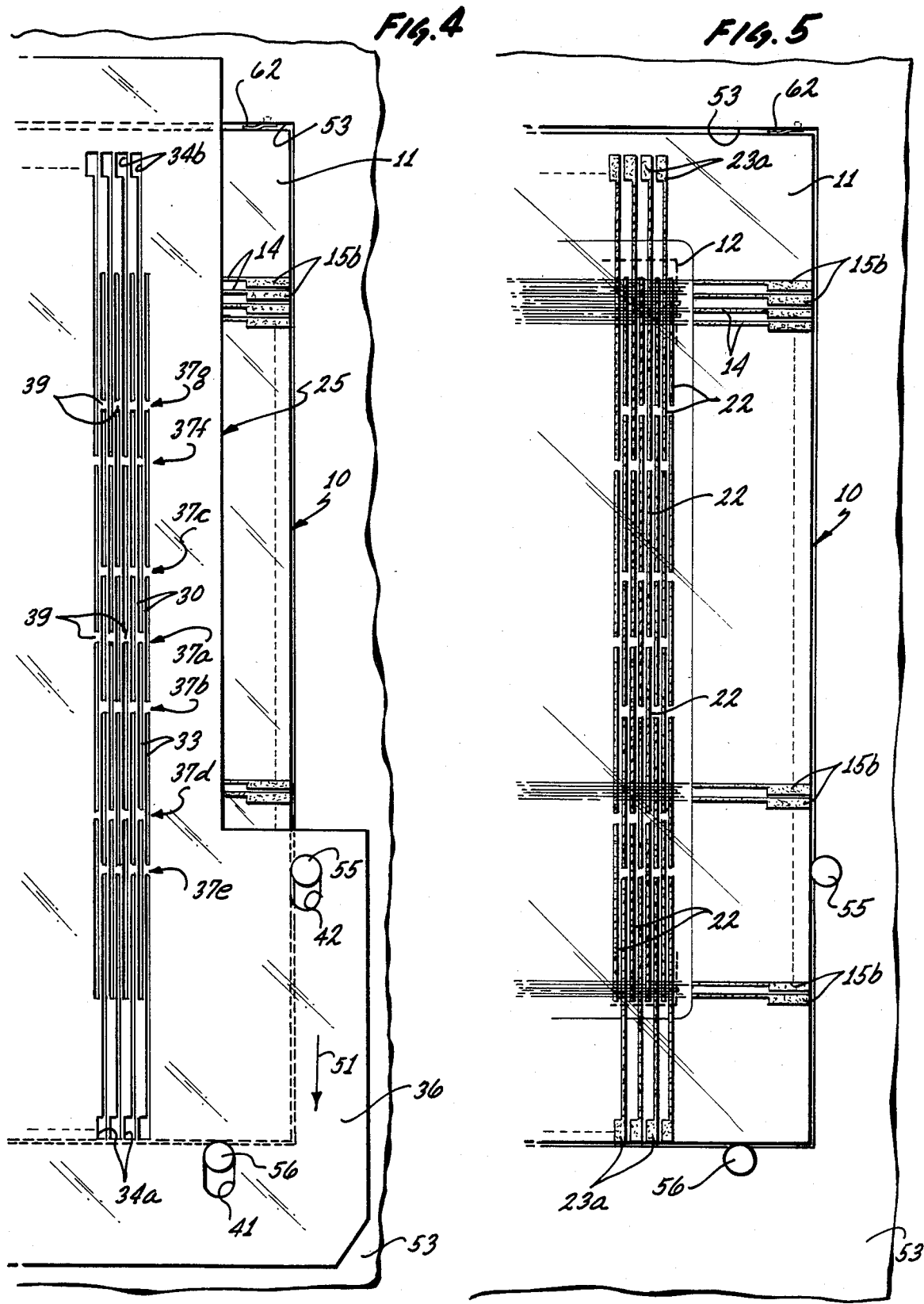

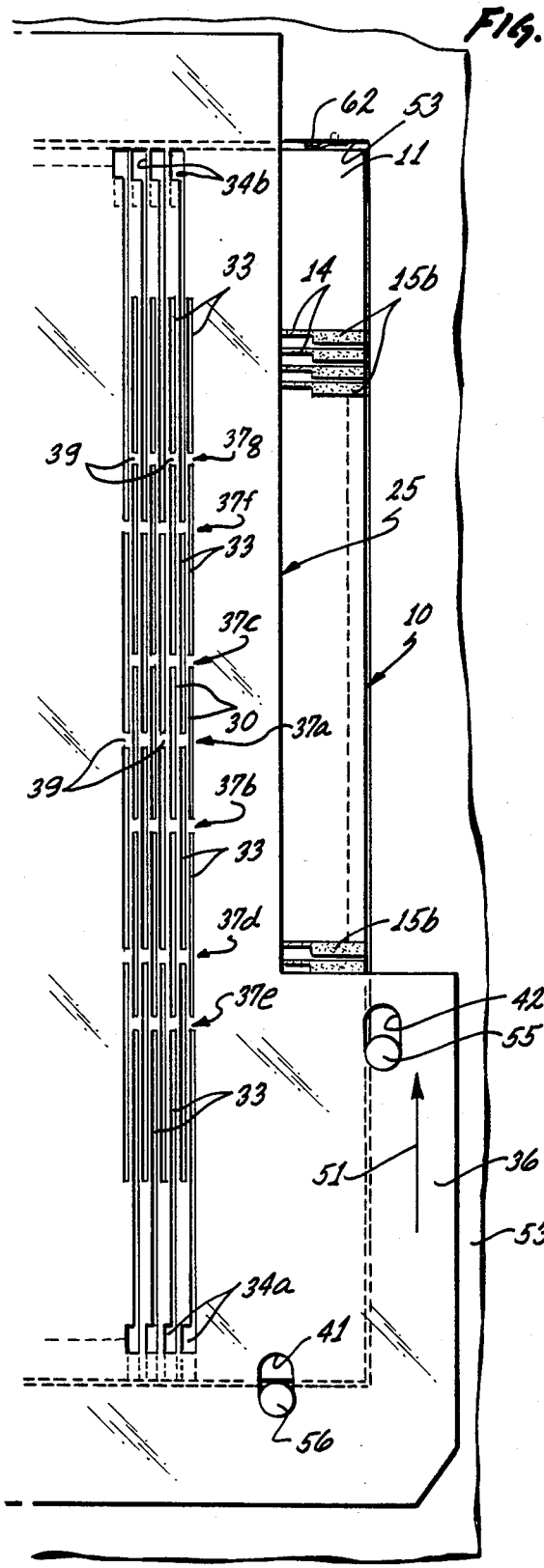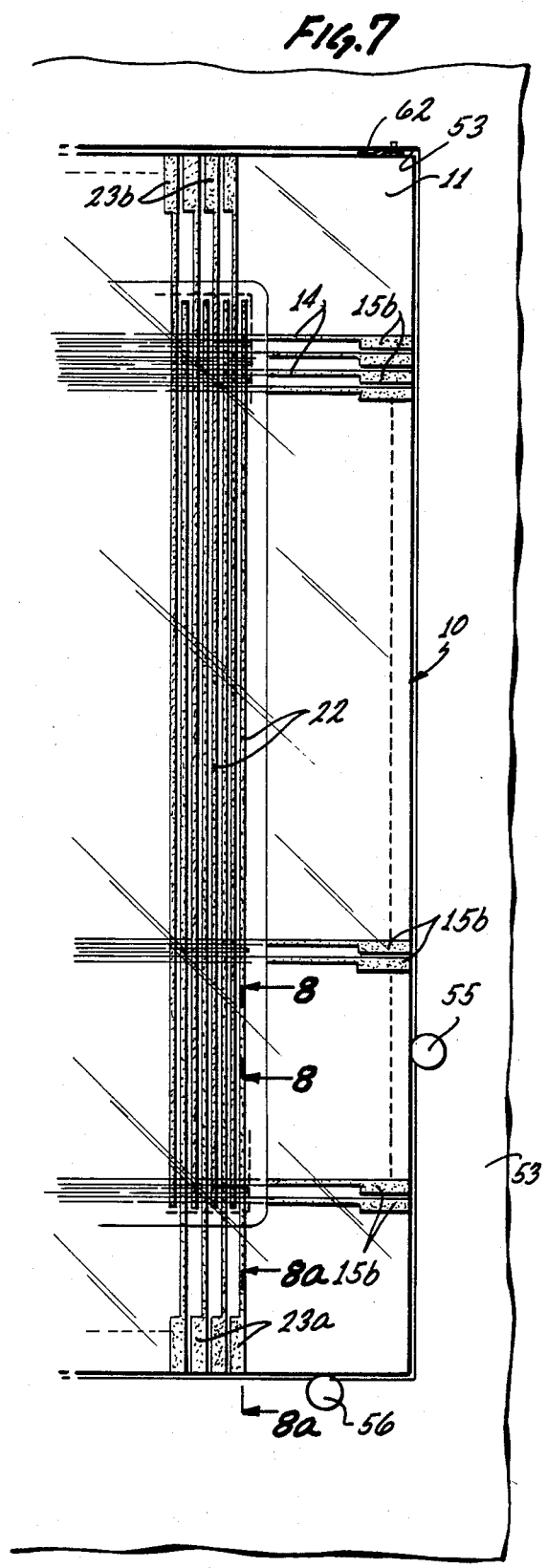

MASK FOR VACUUM DEPOSITING BACK METAL ELECTRODES ON EL PANEL

BACKGROUND OF THE INVENTION

This invention relates to thin-film EL panels and more particularly to a mask for use in the fabrication of back metal electrodes thereon.

Thin-film electroluminescent (EL) panels are very useful for displaying information inasmuch as the thin-film structure including the cross electrodes therefor can be deposited on a glass substrate thereby providing a matrix display panel capable of being selectively energized to activate individual pixels thereon.

Heretofore, thin-film small EL panels having a resolution of, for example, 56 electrodes per linear inch have been made by placing a thin flexible steel mask over the back surface of the substrate which already has the front transparent electrodes and thin-film structure deposited thereon. The thin flexible steel mask is held flush against the thin-film structure provided on the substrate by a permanent magnet enabling an accurate replica of the mask pattern to be obtained thereon by the vacuum deposition of a metal through the openings thereof. Such an approach is feasible for small, one square inch, EL panels because the filaments on the mask are relatively short.

However, when making larger EL panels, such as 2" by 3" or larger in size, and having a resolution on the order of 56 electrodes or more per linear inch, the closely spaced parallel thin filaments, formed on the mask to define the back metal electrodes, are relatively long. Accordingly, inasmuch as the thin filaments are being supported only at their ends by the frame of the mask, they become distorted sidewise, i.e., bowed along their length, by the magnetic field of the permanent magnet used to hold the mask against the substrate. Consequently, the openings on the mask do not properly define the parallel elongated metal electrodes on the EL panel. Moreover, when the end supported filaments on the mask are relatively long, the intense heat of the tungsten heater coil used to vaporize the metal in the vacuum chamber is radiated to non-uniformly heat the filaments thereby causing distortion or expansion thereof, i.e., causing them to bend outwardly or buckle away from the plane of the substrate in spite of the pull of the magnet. This causes the metal vapor to settle on the substrate behind the filaments so as to not define the metal electrodes but rather continuous areas of metal resulting in some of the electrodes being shorted.

SUMMARY OF THE INVENTION

In accordance with the present invention, a thin flexible steel mask is provided for use in vacuum depositing back metal electrodes on the substrate of an EL panel. The mask is etched to provide reinforcing portions between the long closely spaced filaments which define the openings through which the metal vapor is vacuum deposited to form the metal electrodes. The mask is held in an initial position flush against the surface of the substrate by a permanent magnet while a first deposit of metal vapor is made therethrough. The mask is then shifted with respect to the substrate in a direction along the length of the filaments and held by the permanent magnet in the shifted position while a second deposit of metal vapor is made therethrough. As a result, those areas of the substrate which were previously covered by the reinforcing portions on the mask are now deposited on thereby forming the continuous long parallel metal electrodes as needed for the EL panel.

Accordingly, one of the objects of the present invention is to provide a mask which can be used for the vacuum depositing of long, high resolution, back metal electrodes on the substrate of an EL panel.

Another object of the present invention is to provide a novel method for depositing long, high resolution, back metal electrodes on a substrate of an EL panel.

With these and other objects in view, the invention consists of the construction, arrangement and combination of the various parts of the device whereby the objects contemplated are attained as hereinafter set forth, pointed out in the appended claims and illustrated in the accompanying drawings.

BRIEF DESCRIPTION OF THE DRAWINGS

FIG. 1 is a plan view of a substrate of an EL panel prior to having the back metal electrodes deposited thereon;

FIG. 2 is a plan perspective view of the embodiment of the mask of the present invention provided for depositing the back metal electrodes on the substrate shown in FIG. 1;

FIG. 2a is an enlarged plan perspective view of a portion of the mask shown in FIG. 2;

FIG. 3 is a diagrammatic showing of a vacuum chamber used to evaporate the back metal electrodes on the substrate of the EL panel;

FIG. 3a is an exploded perspective view of a holder unit used for holding the mask against the back surface of the substrate of the EL panel within the vacuum chamber;

FIG. 4 is a partial plan view showing the mask being held within the holder unit in position against the back surface of the substrate of the EL panel during the first step of the depositing of the metal vapor therethrough;

FIG. 5 shows the electrode pattern as formed on the back surface of the substrate of the EL panel after the first step of the depositing of the metal vapor through the mask;

FIG. 6 is a partial plan view showing the mask being held within the holder unit in position against the back surface of the substrate of the EL panel during the second step of the depositing of the metal vapor therethrough;

FIG. 7 shows the back electrodes as formed on the back surface of the substrate of the EL panel after the second step of the depositing of the metal vapor through the mask;

FIG. 8 is a sectional view of a portion of one of the metal electrodes on the substrate of the EL panel as taken on line 8—8 of FIG. 7;

FIG. 8a is a sectional view of a terminal pad on the end of a back metal electrode as taken on line 8a—8a of FIG. 7; and FIG. 9 is a plan view of the back surface of the substrate of the EL panel in FIG. 1 after the back metal electrodes have been deposited thereon by use of the mask of the present invention.

DETAILED DESCRIPTION OF THE INVENTION

Referring to the drawings, FIG. 1 shows an EL panel 10 comprising a rectangular glass substrate 11 of such a size as to accomodate an active area 12 thereon which is on the order of 2" by 3". The substrate 11 is provided with thin-film transparent Indium Tin Oxide (ITO) electrodes 14 extending horizontally and lying directly on the surface of the substrate 11. Alternate of the electrodes 14 extend beyond the active area 12 on one side of substrate 11 to form terminal pads 15a and the remaining ones of the ITO electrodes extend beyond the active area 12 on the opposite side of the substrate to form terminal pads 15b. The linear density of the ITO electrodes 14 may be on the order of 56 per linear inch or more and are formed by the photolithographic process. Directly deposited over the surface of the substrate 11 carrying the ITO electrodes 14 is a first thin-film layer 16 of a dielectric followed by a thin-film layer 18 of an electroluminescent material, and then a second layer 20 of a dielectric. The thin-films are all on the order of 1500 to 6000 Angstrom units thick. The substrate 11 is now ready to have the thin-film aluminum counter electrodes 22 deposited thereon by use of the mask 25 and the method of the present invention.

FIG. 2 shows a preferred embodiment of the mask 25 as constructed in accordance with the present invention to be used for depositing the metal electrodes 22 (FIG. 9) on the back surface of the substrate 11 of the EL panel 10 in FIG. 1. The mask 25 is formed of a thin flexible rectangular sheet of steel having a thickness on the order of five thousandths of an inch. Projecting portions 35 and 36 are preferably formed on the bottom left and right sides of the mask. The central active area 28 of the mask 25 has been etched by the photolithographic process to provide a series of parallel filaments 30 extending between the top and bottom thereof. In the preferred embodiment of the mask 25, the filaments 30 are 10 mils wide and spaced so as to provide openings therebetween which are 7 mils wide.

In accordance with the present invention, in order to hold the long thin filaments 30 in the plane of the mask 25 and in parallel relationship with each other, at the time the mask is etched, rows of reinforcing portions 39 are integrally formed to bridge the spacing between successive pairs of the filaments 30. Each of the reinforcing portions 39 has a length L, as indicated in FIG. 2a.

As best illustrated in FIG. 2a, the central portion of the active area 28 of the mask 25 which heats up the most in the vacuum chamber 45 due to the radiation from the tungsten heater coil 63 is provided with three rows 37a, 37b and 37c of reinforcing portions 39.

Thus, in row 37a, starting from the right side of the active area 28, a first reinforcing portion 39 is provided to bridge the spacing between the first and second filaments 30, a second reinforcing portion 39 is provided to bridge the spacing between the third and fourth filaments 30, a third reinforcing portion 39 is provided to bridge the spacing between the fifth and sixth filaments 30, etc. Spaced approximately three-sixteenth of an inch below the row 37a is the row 37b of reinforcing portions wherein, starting from the right side of the active area 28, a first reinforcing portion 39 is provided to bridge the spacing between the side frame of the mask 25 and the first filament 30, a second reinforcing portion 39 is provided to bridge the spacing between the second and the third filaments 30, a third reinforcing portion 39 is provided to bridge the spacing between the fourth and fifth filaments 30, etc. Spaced approximately three-sixteenth of an inch above the row 37a is the row 37c of reinforcing portions 39 wherein the reinforcing portions 39 are provided between the filaments 30 in an arrangement identical to the reinforcing portions 39 in row 37b.

It should now be clear that the reinforcing portions 39 provided in rows 37b and 37c are in line with each other but staggered with respect to the reinforcing portions 39 provided in row 37a.

In the middle portion of the lower half of the active area 28 of the mask 25, two more rows 37d and 37e of the reinforcing portions 39 are provided to bridge the spacings between the filaments 30. The rows 37d and 37e are spaced approximately one-eighth of an inch apart with the reinforcing portions 39 in row 37d having a zigzag arrangement with respect to the reinforcing portions 39 in row 37e.

Likewise, in the middle portion of the upper half of the active area 28 of the mask 25, two more rows 37f and 37g of the reinforcing portions 39 are provided to bridge the spacings between the filaments 30. The rows 37f and 37g are similarly spaced approximately one-eighth of an inch apart with the reinforcing portions in row 37f having a zigzag arrangement with respect to the reinforcing portions 39 of row 37g.

It should now be clearly understood that the reinforcing portions 39 serve to stiffen and rigidly hold the long thin filaments 30 in the active area 28 of the mask 25 by shortening their free length portions. As a result, the reinforcing portions 39 divide the spacing between adjacent filaments 30 into a series of elongated openings 33.

As best illustrated in FIGS. 2 and 2a, alternate ones of the series of elongated openings 33 formed between adjacent filaments 30 on the mask 25 extend to terminal openings 34a on the bottom thereof and the remaining ones of the series of elongated openings 33 between the adjacent filaments 30 on the mask 25 extend to terminal openings 34b on the top thereof.

The mask 25 is provided with a single elongated locating hole 40 on the left projection portion 35 thereof and with a pair of spaced elongated locating holes 41 and 42 on the right projection portion 36 thereof. The longitudinal axis of each of the elongated holes 40, 41 and 42 is parallel to the filaments 30 and the length of each of the elongated holes is approximately two and one-half times the length L of a reinforcing portion 39. The tops of the elongated holes 40 and 41 are in alignment with the bottoms of the terminal openings 34a on the mask 25 and the left side of the elongated hole 42 on the right projection portion 36 is in alignment with the side edge of the substrate 11 for the EL panel 10 when the mask 25 is placed thereover.

Reference will next be made to FIG. 3 which diagrammatically illustrates a vacuum chamber 45 as typically used for vapor deposition through a mask onto the substrate 11.

The vacuum chamber 45 is provided with a holder unit 47 located near the upper end thereof. An exploded view of the components of the holder unit 47 is shown in FIG. 3a. Thus, the holder unit 47 includes an upper circular plate 48 provided with a rectangular recess 49 for receiving a permanent magnet 50, a middle circular plate 52 provided with a rectangular recess 53 for receiving the substrate 11 shown in FIG. 1 with the back surface thereof facing downwardly, and a bottom circular plate 57 provided with a rectangular opening 59. The circular plates of the holder unit 47 are made of aluminum.

The middle circular plate 52 has a locating pin 54 on the left side of the bottom wall of recess 53 and a locating pin 55 on the right side of the bottom wall of recess 53. In addition, a locating pin 56 is located on the lower right sidewall of recess 53. The sides of pins 54, 55 and 56 extend a few thousandths of an inch into the recess 53 thus providing a three point contact for the bottom and right sides of the substrate 11 when positioned in the recess 53. Leaf springs 62, for example, are provided in the recess 53 on the opposite sides of the substrate 11 for urging the latter up against the pins 54, 55 and 56.

The pins 54, 55 and 56 are further used to position the mask 25 relative to the substrate 11 by passing through the elongated holes 40, 41 and 42 provided thereon. The mask 25 is initially positioned over the substrate 11 and held by magnet 50 with the pins 54, 55 and 56 in the upper ends of the elongated holes 40, 41 and 42, as illustrated in FIG. 4. The bottom circular plate 57 of the holder unit 47 is then placed over the mask 25. It should be noted that the rectangular opening 59 in the bottom circular plate 57 extends beyond either side of the active area 28 and beyond the terminal openings 34a and 34b on the top and bottom of the mask 25. Clearance holes 58 are provided on the bottom circular plate 57 for receiving each of the pins 54, 55 and 56. Wingnuts 60 are provided on the ends of four screws 61 extending down through holes provided on the upper circular plate 48, the middle circular plate 52 and the bottom circular plate 57 to hold the parts of the holder unit 47 together.

The holder unit 47 with the mask 25 in position over the substrate 11 is then positioned and supported in the upper end of the vacuum chamber 45 with the rectangular opening 59 in the lower circular plate 57 generally facing downwardly.

A tungsten heater coil 63 is provided at the bottom of the vacuum chamber 45. Bent thin strips 64 of aluminum are placed over the coils 63. Upon heating the strips 64 of aluminum by energizing the tungsten heater coil 63, the aluminum metal vaporizes in the high vacuum chamber 45 and passes through the series of elongated openings 33 formed between the filaments 30 on the mask 25 to settle on the exposed surface of the substrate 11, as illustrated in FIG. 4.

Thus, after the substrate 11 is exposed to the aluminum vapors for the first time through the mask 25 as positioned in FIG. 4, upon taking the holder assembly 47 out of the vacuum chamber 45 and removing the bottom circular plate 57 and the mask 25, the aluminum pattern deposited on the substrate 11 is that shown in FIG. 5. It is noted that the metal pattern provided along the length of the electrodes 22 is not continuous because of the presence of the rows 37a–37g of reinforcing portions 39 on the mask 25.

In accordance with the present invention, the mask 25 is now moved upwardly as indicated by arrow 51 in FIG. 6 such that the locating pins 54, 55 and 56 on the central circular plate 52 are now positioned on the lower ends of the elongated holes 40, 41 and 42. This changes the position of the mask 25 relative to the metal pattern previously deposited on the substrate 11 so that the reinforcing portions 39 are now covering up the areas where aluminum has already been deposited and the elongated openings 33 are now leaving exposed the places which have not yet had any aluminum deposited thereon. The bottom circular plate 57 is then placed back on the holder unit 47 and the latter is again positioned within the vacuum chamber 45. The aluminum strips 64 on the tungsten heater coil 63 are then heated up again causing the aluminum vapor to settle a second time through the openings 33 on the mask 25 onto the surface of the substrate 11. Now then, when the holder unit 47 is taken out of the vacuum chamber 45 and the mask 25 removed from the substrate 11, the latter has a pattern deposited thereon as illustrated in FIG. 7 wherein each of the aluminum electrodes 22 is now continuous.

It should be noted, as illustrated in FIG. 8, that since the major portion of the length of each of the electrodes 22 receives a double exposure of aluminum vapor in the vacuum chamber 45, those major portions are twice as thick as the minor portions thereof that only receive a single exposure of the aluminum vapor thereon. However, inasmuch as the back metal electrodes 22 are the last to be deposited on the substrate, it is of no concern that they are not of uniform thickness as long as each exposure in the vacuum chamber 45 is long enough to provide the minimum thickness required to carry the field and the current used to operate the EL panel 10. For example, if the first exposure is 1000 Angstrom units thick, which is the minimum needed, the second exposure of 1000 Angstrom units thickness assures that the electrodes 22 are at least 1000 Angstrom units thick at all points thereof. Thus, the fact that a large portion of the electrodes is 2000 Angstrom units thick is of no concern.

FIG. 8a is an exaggerated cross sectional view of the terminal pad 23a of an electrode 22 as taken along line 8a—8a of FIG. 7 showing how its thickness varies due to the double exposure of aluminum vapor through the mask 25. However, because of the thinness of the successive deposits, the variation in the thickness of the terminal pads is negligible as far as providing electrical contact therewith.

It should now be clearly understood that because of the mask 25 and the method of using it to deposit the metal back electrodes 22 in accordance with the present invention, there is now no limit to the resolution or the length to which the back metal electrodes 22 can be deposited by use of the vacuum deposition process on the substrate 11 of an EL panel.

While the description has been concerned with a particular structural embodiment of the present invention, it is to be understood that many modifications and variations in the construction and arrangement thereof may be provided for without departing from the spirit and scope of the invention or sacrificing any of its advantages. The invention is, therefore, considered as including all such possible modifications and variations coming within the legitimate and valid scope of the appended claims.

What is claimed is:

1. A method of depositing counter metal electrodes on the back of a glass substrate already having thereon a thin-film structure including front transparent electrodes and an electroluminescent layer sandwiched between dielectric layers, said method comprising:

providing a flexible steel mask with a plurality of long parallel closely spaced filaments having spacings corresponding to the width of the back metal electrodes to be deposited on said substrate, and having reinforcing portions bridging the spacings between the filaments for reducing the free length portions of the filaments;

positioning said mask on the back of said substrate while holding said filaments and said reinforcing portions flush against the substrate by a magnet;

vacuum depositing a metal through the spacings of said filaments as provided on said mask;

repositioning said mask on the back of said substrate by shifting it along the length of its filaments at least a distance equal to the length of said reinforcing portions so as to position said reinforcing portions over the areas of the substrate that have already been deposited on while holding said filaments nd said reinforcing portions flush against said substrate by said magnet; and again vacuum depositing the metal through the spacings of said filaments as provided on said mask so as to complete the forming of said counter metal electrodes on the back of said substrate.

2. A method of depositing metal back electrodes on a substrate already having deposited thereon front transparent electrodes and a thin layer of an electroluminescent material sandwiched between thin layers of a dielectric, comprising the steps of:

providing a flexible steel mask having a plurality of parallel closely spaced filaments formed thereon with rows of reinforcing portions positioned for reducing the free length portions of said filaments and defining a series of elongated openings between the filaments on said mask;

positioning said mask with respect to said substrate;

holding the filaments and reinforcing portions of said mask flush against the surface of said substrate by a permanent magnet;

placing said substrate and mask in a vacuum chamber;

depositing a first layer of vaporized metal through the elongated openings defined on said mask by the filaments and reinforcing portions;

removing said substrate and mask from said vacuum chamber;

repositioning said mask lengthwise of its elongated openings with respect to said substrate just enough to ensure the positioning of said reinforcing portions so that they are now covering the areas on the substrate that have already been deposited upon and are leaving exposed the areas that have yet to be deposited upon;

holding the filaments and reinforcing portions of said mask in their new position flush against the surface of said substrate by said permanent magnet;

replacing said substrate and mask in the vacuum chamber; and depositing a second layer of vaporized metal through the elongated openings defined on said mask by the filaments and reinforcing portions so as to complete the forming of said metal back electrodes on the substrate.

3. A method of depositing metal back electrodes on a substrate already having deposited thereon front transparent electrodes and a thin layer of an electroluminescent material sandwiched between thin layers of a dielectric, as defined in claim 2 wherein the thickness of each said first and second layers of vaporized metal is equivalent to the minimum thickness needed to carry the field and current requirements for the metal back electrodes.

4. A method of depositing counter metal electrodes on the back of a glass substrate already having thereon a thin-film structure including front transparent electrodes and an electroluminescent layer sandwiched between dielectric layers, said method comprising:

providing a flexible steel mask having a plurality of long closely spaced parallel filaments, the spacings of which correspond to the width of the back metal electrodes to be deposited on said substrate, and having reinforcing portions bridging the spacings between the filaments, said reinforcing portions being provided in at least two spaced rows extending transversely to the lengths of said filaments with the reinforcing portions in said rows having a zig-zag arrangement;

positioning said mask on the back surface of said substrate with said filaments and reinforcing portions held flush thereagainst by a magnet;

vacuum depositing a metal through the spacings of said filaments as provided on said mask;

repositioning said mask on the back surface of said substrate by shifting it along the length of its filament such that said reinforcing portions are located over the areas that have already been deposited on and with said filaments and reinforcing portions held flush thereagainst by said magnet; and again vacuum depositing the metal through the spacings of said filaments on said mask so as to provide for completing the forming of said counter metal electrodes on said substrate.

5. A method of depositing metal back electrodes on a substrate already having deposited deposited thereon front transparent electrodes and a thin layer of an electroluminescent material sandwiched between thin layers of a dielectric, comprising the steps of:

providing a flexible steel mask having a plurality of long closely spaced parallel filaments formed thereon and having spaced rows of reinforcing portions bridging the spacings between the filaments, said reinforcing portions being positioned between the filaments to reduce the free length portions thereof;

positioning said mask with respect to said substrate;

holding said mask including said filaments and said reinforcing portions flush against the surface of said substrate by a magnet, said reinforcing portions providing for preventing the filaments from being bowed sidewise by the magnetic field of said magnet;

placing said substrate and mask in a vacuum chamber;

vacuum depositing a first layer of vaporized metal as provided by an evaporation source through the elongated openings defined on said mask by the filaments and reinfocing portions so as to form elongated sections of said back electrodes on said substrate, said reinforcing portions providing additional mass for enabling said magnet to pull said filaments against the surface of said substrate to prevent buckling of said filaments away from the substrate surface by the heat of said evaporation source;

removing said substrate and mask from said vacuum chamber;

repositioning said mask lengthwise of its elongated openings with respect to said substrate at least the length of said reinforcing portions;

again holding said mask including said filaments and said reinfocing portions in said new position flush against the surface of said substrate by said magnet;

replacing said substrate and mask in the vacuum chamber; and vacuum depositing a second layer of vaporized metal as provided by said evaporation source through the elongated openings defined on said mask by the filaments and reinforcing portions so as to complete the forming of said back metal electrodes on said substrate.

6. A method of vacuum depositing a pattern of closely spaced long parallel conductive lines on a substrate, said method comprising:
- providing a flexible mask of magnetic material having a plurality of long closely spaced parallel filaments with reinfocing portions positioned across the spacings of the filaments in a zig-zag manner to reduce the free length portions thereof;
- positioning said mask on the back of said substrate;
- holding said mask in said position flush against the substrate by a magnet;
- vacuum depositing a metal through the spacings of said filaments as provided on said mask;
- repositioning said mask by shifting it along the length of its filaments at least a distance equal to the length of said reinforcing portions so as to position said reinforcing portions over the areas of the substrate that having already been deposited upon;
- holding said mask in its shifted postiion against the substrate by said magnet; and
- again vacuum depositing the metal through the spacings of said filaments as provided on said mask so as to complete the vacuum deposition of said conductive lines on said substrate.

* * * * *